(12) United States Patent
Barber et al.

(10) Patent No.: US 11,439,024 B2
(45) Date of Patent: Sep. 6, 2022

(54) METHOD FOR MANUFACTURING WATER RESISTANT PRINTED CIRCUIT BOARD

(71) Applicant: Steering Solutions IP Holding Corporation, Saginaw, MI (US)

(72) Inventors: Shawn M. Barber, Bay City, MI (US); John I. Chu, Saginaw, MI (US); Wayne B. Thomas, Saginaw, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 0 days.

(21) Appl. No.: 16/931,424

(22) Filed: Jul. 16, 2020

(65) Prior Publication Data
US 2022/0022324 A1     Jan. 20, 2022

(51) Int. Cl.
| | |
|---|---|
| H05K 3/28 | (2006.01) |
| H05K 3/30 | (2006.01) |
| H05K 3/46 | (2006.01) |
| B05D 1/36 | (2006.01) |
| H05K 3/26 | (2006.01) |
| B05D 1/18 | (2006.01) |
| B05D 1/38 | (2006.01) |
| B05D 1/02 | (2006.01) |
| B05D 3/04 | (2006.01) |
| B05D 7/00 | (2006.01) |
| H05K 5/00 | (2006.01) |

(52) U.S. Cl.
CPC ............... *H05K 3/285* (2013.01); *H05K 3/30* (2013.01); *H05K 3/4644* (2013.01); *B05D 1/02* (2013.01); *B05D 1/18* (2013.01); *B05D 1/36* (2013.01); *B05D 1/38* (2013.01); *B05D 3/046* (2013.01); *B05D 7/50* (2013.01); *H05K 3/26* (2013.01); *H05K 3/28* (2013.01); *H05K 3/284* (2013.01); *H05K 5/0095* (2013.01); *H05K 2203/095* (2013.01)

(58) Field of Classification Search
CPC ............ H05K 3/26; H05K 3/28; H05K 3/284; H05K 3/285; H05K 3/30; H05K 5/0095; B05D 1/02; B05D 1/18; B05D 1/36; B05D 1/38; B05D 3/046; B05D 7/50
USPC ................ 427/97.3, 96.6, 534, 535
See application file for complete search history.

(56) References Cited

U.S. PATENT DOCUMENTS

| | | | | |
|---|---|---|---|---|
| 4,255,469 A | * | 3/1981 | McGinness | B05D 1/32 427/282 |
| 4,874,960 A | * | 10/1989 | Cybela | G06F 1/30 307/64 |
| 5,346,728 A | * | 9/1994 | Yoshida | B29C 59/14 427/569 |
| 5,498,642 A | * | 3/1996 | Chu | B29C 70/84 522/40 |
| 5,871,822 A | * | 2/1999 | Lepsche | H05K 3/0091 427/96.4 |
| 6,677,251 B1 | * | 1/2004 | Lu | H01L 21/76826 438/618 |

(Continued)

*Primary Examiner* — Brian K Talbot
(74) *Attorney, Agent, or Firm* — Dickinson Wright PLLC

(57) ABSTRACT

A method for manufacturing a water resistant substrate comprises a first step of providing a substrate. The method proceeds with a step of populating at least one component onto the substrate. Next, the method includes a step of cleaning the substrate including the at least one component to form a cleaned substrate. Then, the method proceeds with depositing a multi-layered water resistant coating onto the cleaned substrate.

6 Claims, 4 Drawing Sheets

(56) References Cited

U.S. PATENT DOCUMENTS

| | | | | |
|---|---|---|---|---|
| 2003/0185973 | A1* | 10/2003 | Crawley | B05D 3/147 427/569 |
| 2005/0095366 | A1* | 5/2005 | Fang | H05K 3/0091 427/421.1 |
| 2006/0152913 | A1* | 7/2006 | Richey | H05K 9/0024 361/818 |
| 2007/0095368 | A1* | 5/2007 | Girard | H05K 3/288 134/38 |
| 2007/0157457 | A1* | 7/2007 | Fried | G01M 3/3281 29/592.1 |
| 2011/0253429 | A1* | 10/2011 | Humphries | H01L 24/45 174/255 |
| 2013/0176700 | A1* | 7/2013 | Stevens | H05K 1/185 361/760 |
| 2015/0200317 | A1* | 7/2015 | Kretschmann | B05D 3/107 428/447 |
| 2017/0008210 | A1* | 1/2017 | Koellnberger | B29C 48/21 |
| 2017/0094810 | A1* | 3/2017 | Aresta | H05K 1/181 |
| 2018/0083662 | A1* | 3/2018 | Ahmad | H04B 1/3888 |
| 2019/0037705 | A1* | 1/2019 | Singh | B05D 1/62 |

\* cited by examiner

METHOD FOR MANUFACTURING WATER RESISTANT PRINTED CIRCUIT BOARD

FIELD OF THE INVENTION

The present disclosure relates to a method for manufacturing a water resistant substrate and, more particularly, a method for manufacturing a water resistant printed circuit board populated with at least one component.

BACKGROUND

Automotive OEMs have expressed desire to have a water-resistant coating applied to circuit card assemblies which are used in the Electronic Power Steering ("EPS") systems for vehicles equipped with Autonomous Driver Assistance System ("ADAS"). Industry research shows that Parylene C and Parylene F are common materials used to provide water resistance for a circuit card assembly ("CCA") wherein CCA is a printed circuit boards ("PCB") populated with at least one electronic component. This material is used in many industries such as but not limited to Automotive, Aerospace, Medical, and Military.

One conventional method for providing water resistance to the CCA is disposing a dam around the CCA and fill the dam with silicone gel to establish a water-resistant layer of Silicone that is roughly ¼ of an inch thick all over the surface of the CCA. Another conventional method for manufacturing water resistant CCA comprises a first step of placing the CCA on custom racks and placing the custom racks including the CCA into a furnace. The method proceeds with placing a raw material of a water resistant coating, e.g. Parylene C or Parylene F, in a vaporizer of the furnace. Next, the raw material of the water resistant coating is heated in a pyrolizer of the furnace, thereby converting the raw material from a solid to a vapor. Then, the vapor is deposited onto the CCA in a deposition chamber of the furnace. After depositing the vapor, the vapor forms a uniform, thin film polymer barrier around the device including the CCA with all components to provide water resistance to the PCB and all of the electrical components in their entirety.

There are a few undesirable issues for the above-described conventional methods. First, the above-described conventional methods can only reliably prevent electrical failure for 8 hours when immersed in 5% saline solution. The canary circuit is a multiple switch board ("MSB") located in the housing which was uncoated and would fail and shut the system down before any damage occurred to the electronics. The drawback to the above coating is that the dam feature and application process takes up a lot of space and makes it impossible to apply in a dual board system.

In other words, it can be understood that the conventional methods are not designed to provide water proofing that enables the ADAS EPS to function under water indefinitely, but rather, to apply a coating that will render the ADAS EPS system impervious to water for a finite period. The idea is that during the above period the system will first detect the water intrusion by means such as a canary circuit (non-coated MSB). Next, having detected water intrusion into the ADAS power pack the vehicle will proceed to some safe point, set trouble codes and safely shut down.

Additionally, the vapor deposition times (or application time) for the conventional method ranges from 12 hours (for Parylene C) to 18 hours (for Parylene F), thereby making the conventional method to be difficult to streamline. Accordingly, it would be desirable to provide an alternative to the conventional method for manufacturing water resistant CCA which includes the PCB with all of its electrical components.

SUMMARY

The present disclosure provides method for manufacturing a water resistant substrate that overcomes the shortcomings of the conventional method. The present disclosure also provides a method for manufacturing a water resistant substrate that has low manufacturing cost and can be easily streamlined. Moreover, the present disclosure provides a method for manufacturing a water resistant substrate wherein the water resistant substrate can withstand a wide range of operational temperature.

According to one aspect of the present disclosure, a method for manufacturing a water resistant substrate comprises a first step of providing a substrate. The method proceeds with a step of populating at least one component onto the substrate. Next, the method includes a step of cleaning the substrate including the at least one component to form a cleaned substrate. Then, the method proceeds with depositing a multi-layered water resistant coating onto the cleaned substrate.

According to another aspect of the present disclosure, a method for manufacturing a water resistant substrate comprises a first step of providing a substrate. The method proceeds with a step of populating at least one component onto the substrate. Next, the method includes a step of covering a portion of a surface of the substrate including the at least one component. Then, the method proceeds with a step of cleaning the substrate including the at least one component to form a cleaned substrate. The method further includes a step of depositing a multi-layered water resistant coating onto the cleaned substrate. The multi-layered water resistant contains silicone.

These and other advantages and features will become more apparent from the following description taken in conjunction with the drawings.

BRIEF DESCRIPTION OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 2:
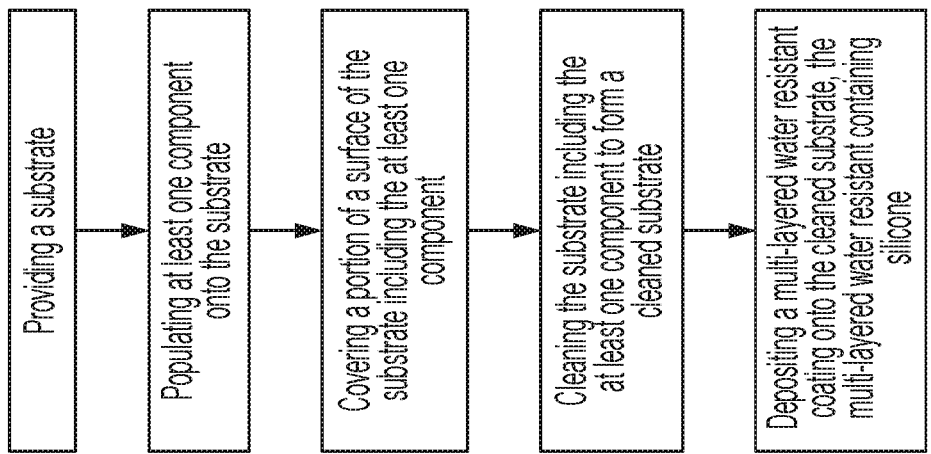
FIG. 2 is a schematic flowchart illustrating a method for manufacturing a water resistant substrate according to another aspect of the present disclosure.
Figure 1:
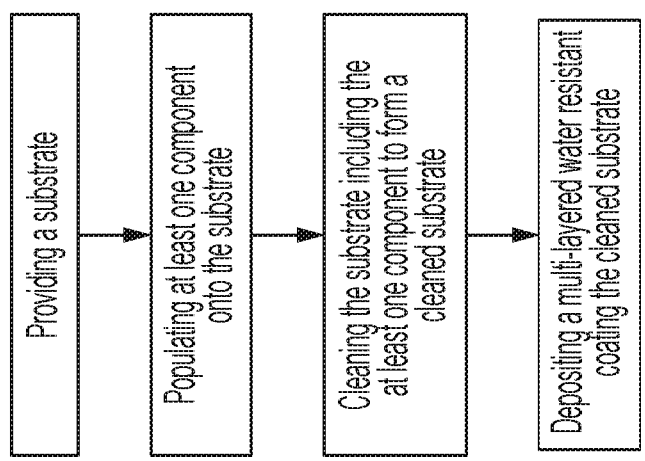
FIG. 1 is a schematic flowchart illustrating a method for manufacturing a water resistant substrate according to an aspect of the present disclosure.
Figure 3:
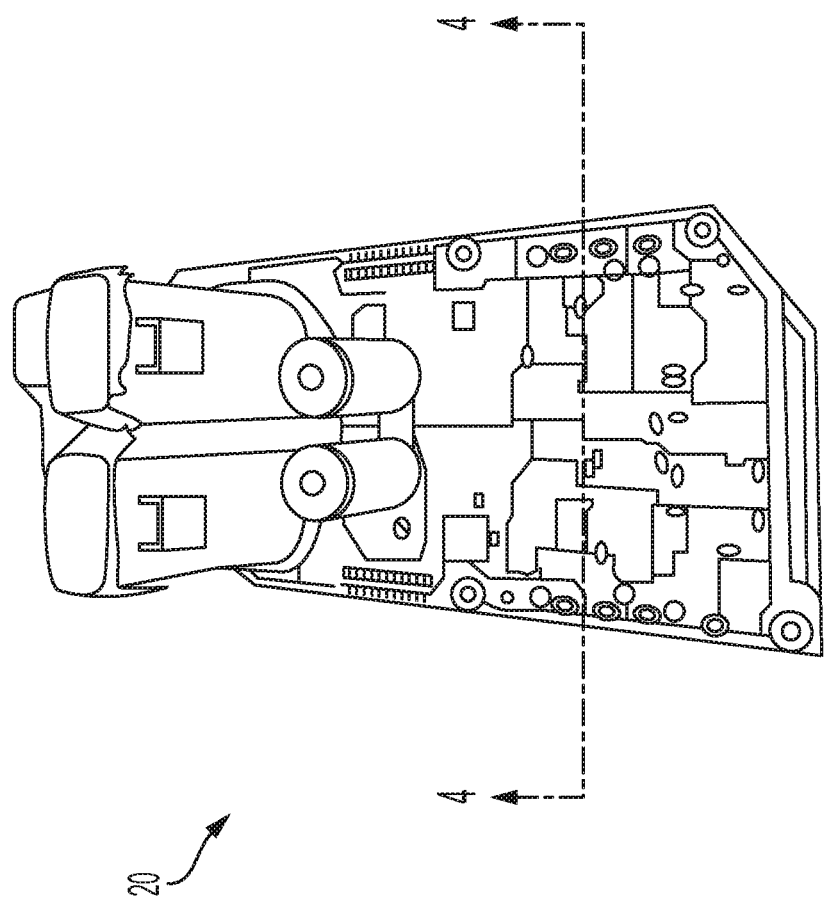
FIG. 3 is a perspective view of an water resistant substrate according to an aspect of the present disclosure.
Figure 4:
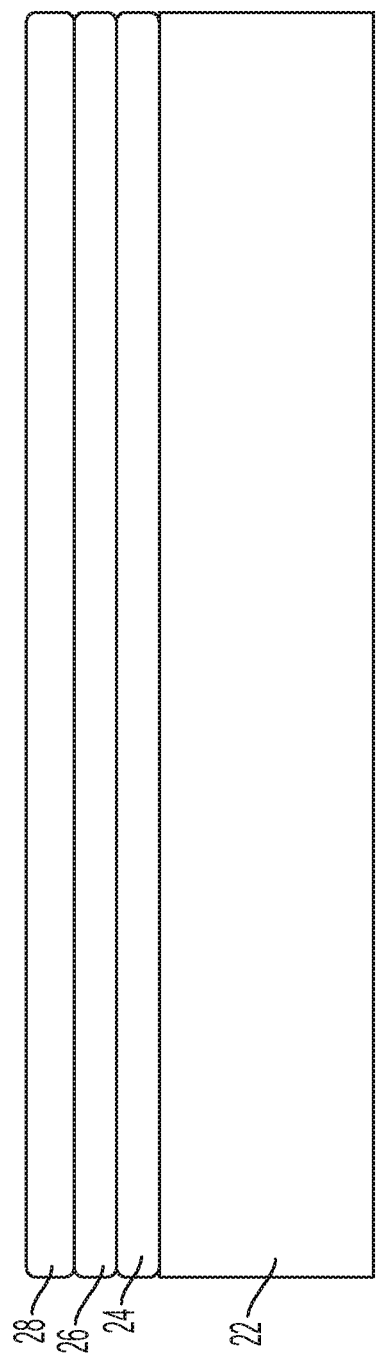
FIG. 4 is a cross-sectional view of the water resistant substrate along the lines of 4-4 in FIG. 3.
Figure 5:
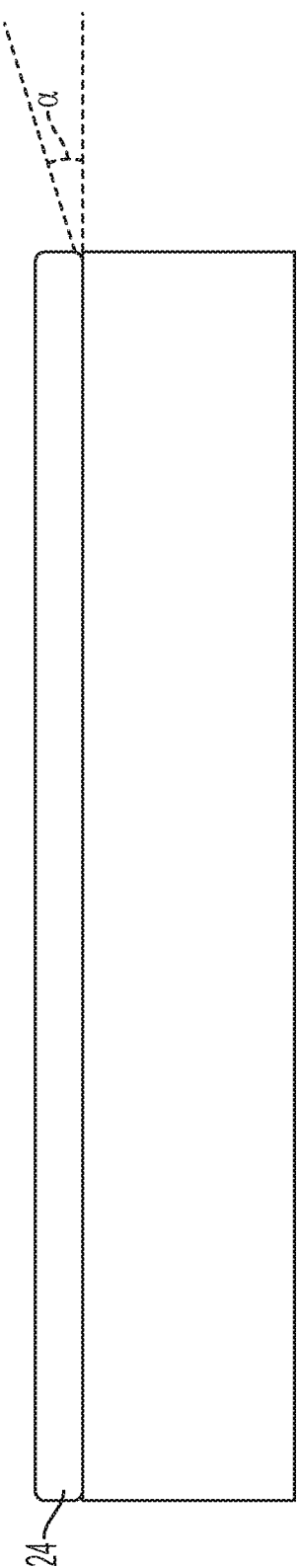
FIG. 5 is a cross-sectional view of the water resistant substrate including a first water resistant layer according to an aspect of the present disclosure.

Referring now to the Figures, where the invention will be described with reference to specific embodiments, without limiting same, a method for manufacturing a water resistant substrate 20 in accordance with an aspect the present disclosure is generally shown in FIG. 1.

Referring to FIG. 1, the method comprises a first step of providing a substrate 22. The step of providing the substrate 22 can be defined as providing a printed circuit board ("PCB") without silkscreens. Silkscreens are white and readable letters for identifying components, test points, and PCB, warning symbols, company logos, date codes and manufacturer marks. According to an aspect of the present disclosure, PCB may not have silkscreens as this would inhibit optimal flow characteristics of a water resistant coating. Accordingly, without the silkscreens, the water resistant coating is able to freely flow on the PCB, thereby allowing the water resistant coating to form a uniform layer on the PCB.

The method then proceeds with a step of populating at least one component onto the substrate 22. The step of depositing the substrate 22 can be defined as populating the at least one component onto at least one surface of the substrate 22 to form a circuit card assembly ("CCA"). For example, the at least one component can include but not limited to capacitors and processors. The at least one component can also be populated on a plurality of surfaces of the PCB to form the CCA. The CCA may be dry and free of moisture. In the event that the CCA has just finished a dual reflow (also known as reflow soldering) or a single/dual selective wave processes, it would not be necessary to bake the CCA as the temperatures incurred during the processes are sufficient to remove the moisture from the CCA. In the event that CCA is required to be stored overnight, the CCA can be stored in an inert atmosphere such as but not limited to a Nitrogen atmosphere. If the inert atmosphere cannot be achieved, the CCA can instead be baked in an oven operating at least 120° C. for at least 6 hours to remove the moisture from the CCA.

Optionally, after the step of populating at least one component onto the substrate 22, the method can include a step of covering a portion of the at least one surface of the substrate 22 including the at least one component. The step of covering can be define as dispensing a masking material onto the portion of the at least one surface of the substrate 22 including the at least one component to cover and protect the portion. In other words, during the step of covering, portions of the surface of the substrate 22 are protected via a masking material wherein the masking material can be cured via ultraviolet light to form a protective layer over the portion of the surface of the substrate 22.

Next, the method proceeds with a step of cleaning the substrate 22 including the at least one component to form a cleaned substrate. The step of cleaning can be defined as removing particulate contaminates from the substrate 22 including the at least one component using an air knife system. In addition to removing particulate contaminates, the air knife system can quickly remove any residual water or other fluids form the substrate 22 including the at least one component. The air knife system converts a low-pressure volume of air into a high-velocity, targeted stream of high-impact air, which exits the air knife system through a thin slot. The air knife system produces a steady and consistent air stream which, in turn, eliminates many quality-control problems, such as spotting or blotching, which can cause surface coating failure. Moreover, the air knife system offers flexibility in positioning the airflow, which allows for the removal of particulate contaminates from irregularly shaped areas, e.g. holes and crevices.

According to an aspect of the present disclosure, following the step of removing particulate contaminates, the step of cleaning can include a step of plasma treating the substrate 22 including the at least one component using a plasma treating system. During the plasma treating step, the plasma treating system operates at zero volts such that surface energy of the substrate 22 including the at least one component is greater than or equal to 72 dynes or a wetting angle measured with a Goniometer is less than or equal to 20°. The substrate 22 having the surface energy being greater than or equal to 72 dynes indicates a high surface tension of the substrate 22 which prevents liquid penetration. Additionally, the wetting angle α of the substrate 22 being less than or equal to 20° indicates the substrate 22 being wettable thereby facilitating with a formation of a uniform film of the water resistant coating on the surface of the substrate 22.

The method then proceeds with depositing a multi-layered water resistant coating 24, 26, 28 onto the cleaned substrate to protect the substrate and the at least one component, i.e. the CCA from sustaining water and/or moisture damage. Each layer of the multi-layered water resistant coating 24, 26, 28 can be disposed over an adjacent layer of the multi-layered water resistant coating 24, 26, 28. According to an aspect of the present disclosure, the step of depositing can be defined as depositing a plurality of three water resistant layers 24, 26, 28 onto the cleaned substrate for preventing water and/or moisture damage to the CCA.

Many materials can be used to form the water resistant layers such as but not limited to Parylene C, Parylene F, or silicone (e.g. DOW SIL CC 8030). Currently, Parylene C is the most prevalent materials in the industries for forming a water resistant conformal coating for products such as pacemakers and iPhones. Because the operational temperature of Parylene C ranges from 85° C. to 100° C. for electronic components that operates at a higher temperature range, e.g. temperatures exceeding 100° C. a variant of Parylene C such as Parylene F, having an operational temperature range from 150° C. to 200° C., can be used. However, switching from Parylene C and Parylene F can significantly increase the cost of production/manufacturing. In addition, Parylene C and Parylene F are applied to components via a specialized process wherein the application of Parylene requires a deposition time from 12 hours (Parylene C) to 18 hours (Parylene F).

According to an aspect of the present disclosure, each water resistant layer of the multi-layered water resistant coating 24, 26, 28 can contain silicone. According to an aspect of the present disclosure, each water resistant layer of the multi-layered water resistant coating 24, 26, 28 is silicone. According to an aspect of the present disclosure, each water resistant layer of the multi-layered water resistant coating 24, 26, 28 consists of silicone. By using silicone, no specialized equipment are needed for the application, thereby reducing the cost of manufacturing of a water resistant substrate 20. In other words, standard coating systems such as Asymtek and PVA system can be used for depositing the multi-layered water resistant coating 24, 26, 28 onto the substrate 22. Further, the silicone for each water resistant layer can be disposed on the cleaned substrate via spray coating can be cured within approximately 30 seconds which allows for streamlined application of successive water resistant layers.

In addition, the operational temperature of silicone can be at least 200° C. for continuous use. Thus, silicone can be used to form the multi-layered water resistant coating 24, 26, 28 for a variety components wherein the components can operate from 85° C. to 200° C. Further, the silicone can also have great thermal conductivity (up to approximately 4.3

W/m*K) in comparison with Parylene (0.082 W/m*K for Parylene C and 0.1 W/m*K for Parylene F). Accordingly, based on the thermal conductivity properties of silicone, areas of the substrate 22 which interfaces with a heat sink through a gap filler can include the water resistant layers and would not be detrimental to heat transfer.

Depending on the complexity of the at least one component, the multi-layered water resistant coating 24, 26, 28 can be deposited onto the cleaned substrate via spraying or dipping. For example, a single board CCA configuration can be easier coated with the water resistant layers 24, 26, 28 via dipping (as also known as dip coating) while a dual stacked board configuration can require spraying (also known as spray coating) for depositing the multi-layered water resistant coating 24, 26, 28. There are also different advantages associated with dip coating and spray coating processes. For instance, spray coating uses one half of the material while dip coating can provide more coverage to hidden zones on the cleaned substrate. Additionally, spray coating offers the easiest process control and raw material management.

According to an aspect of the present disclosure, the step of depositing the multi-layered water resistant coating 24, 26, 28 can be conducted by spraying a first, second, and third water resistant layers 24, 26, 28 onto the cleaned substrate. In particular, after cleaning the substrate 22, the method proceeds with spraying a first water resistant layer 24 onto the cleaned substrate. After spraying the first water resistant layer 24, the first water resistant layer 24 is cured using an ultraviolet light. After curing the first water resistant layer 24, the method proceeds with spraying a second water resistant layer 26 onto the first water resistant layer 24. After spraying the second water resistant layer 26, the second water resistant layer 26 is cured under the ultraviolet light. Then, the method proceeds with spraying a third water resistant layer 28 onto the second water resistant layer 26. After spraying the third water resistant layer 28, the third water resistant layer 28 is cured under the ultraviolet light to establish the multi-layered water resistant coating 24, 26, 28. Any ultraviolet light can be used to cure the first water resistant layer 24, the second water resistant layer 26, and the third water resistant layer 28. According to an aspect of the present disclosure, the ultraviolet light used for curing the first water resistant layer 24, the second water resistant layer 26, and the third water resistant layer 28 can have a wavelength of 280 nm and an intensity of 2 J/cm$^2$.

In other words, during spray coating, each water resistant layer of the multi-layered water resistant coating 24, 26, 28 can be cured after spraying onto the clean substrate. This arrangement provides zero hold time between the depositions of each water resistant layer, thereby improving the streamlining of the process for making a water resistant substrate 20. Accordingly, if the cleaned substrate is treated by spray coating, the final product can be shipped immediately because each water resistant layer is fully cured after each step of the spray coating process.

According to an aspect of the present disclosure, the step of depositing the multi-layered water resistant coating 24, 26, 28 can be conducted by dipping the cleaned substrate in a solution containing the water resistant layer to form a first, second, and third water resistant layers 24, 26, 28 onto the cleaned substrate. In particular, after cleaning the substrate 22, the method proceeds with dipping the cleaned substrate in the solution containing the water resistant layer to form a first water resistant layer 24 on the cleaned substrate. After forming the first water resistant layer 24, the first water resistant layer 24 is cured under an ultraviolet light for a first duration. The first duration can vary greatly depending on the amount of solution being deposited onto the cleaned substrate to form the first water resistant layer 24. For example, according to an aspect of the present disclosure, the first duration can be approximately 24 hours.

After curing the first water resistant layer 24, the method proceeds with dipping the cleaned substrate including the first water resistant layer 24 in the solution to form a second water resistant layer 26 on the first water resistant layer 24. After forming the second water resistant layer 26, the second water resistant layer 26 is cured under the ultraviolet light for a second duration. After curing the second water resistant layer 26, the method continues with dipping the cleaned substrate including the second water resistant layer 26 in the solution form a third water resistant layer 28 on the second water resistant layer 26. After forming the third water resistant layer 28, the third water resistant layer 28 is cured under the ultraviolet light for a third duration to establish the multi-layered water resistant coating 24, 26, 28. The second and third duration can vary greatly depending on the amount of solution being deposited onto the cleaned substrate to form the second water resistant layer 26 and the third water resistant layer 28. For example, according to an aspect of the present disclosure, the second duration and third duration can be approximately 24 hours. Additionally, any ultraviolet light can be used to cure the first water resistant layer 24, the second water resistant layer 26, and the third water resistant layer 28. According to an aspect of the present disclosure, the ultraviolet light used for curing the first water resistant layer 24, the second water resistant layer 26, and the third water resistant layer 28 can have a wavelength of 280 nm and an intensity of 2 J/cm$^2$.

Similar to spray coating, during dip coating, each water resistant layer of the multi-layered water resistant coating 24, 26, 28 can be cured after each dip coating step. Typically, the cure time for each water resistant layer is approximately 24 hours. This allows each water resistance layer to be completely cured before forming another water resistant layer via dip coating. After forming the third water resistant layer 28, the cleaned substrate including the first, second, and third water resistance layers 24, 26, 28 may be cured for at least 5 days before shipping. This allows the areas between the at least one components that are not exposed to the ultraviolet light to moisture cure. Depending on the layout of the substrate 22, the dip coating process may also require secondary mask and mask removal steps to protect post process soldering locations on the substrate 22.

While the invention has been described in detail in connection with only a limited number of embodiments, it can be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A method for manufacturing a water resistant substrate, the method comprising the steps of:
   providing a substrate;
   populating at least one capacitor and at least one processor onto the substrate to form a circuit card assembly;
   cleaning the substrate and the at least one capacitor and the at least one processor to form a cleaned substrate, wherein the step of cleaning comprises plasma treating the substrate including the at least one capacitor and the at least one processor using a plasma treating system, wherein the plasma treating system operates at zero volts such that surface energy of the substrate including the at least one capacitor and the at least one processor is greater than or equal to 72 dynes or a wetting angle measure with a Goniometer is less than or equal to 20°; and depositing a multi-layered water resistant coating onto the cleaned substrate, the multi-layered water resistant coating consisting of three layers, each of the three layers comprising silicone, wherein the step of depositing comprises spraying each layer onto the cleaned substrate.

2. The method of claim 1, wherein each layer of the multi-layered water resistant coating consists of silicone.

3. The method of claim 1, wherein said step of providing the substrate is defined as providing a printed circuit board without any silkscreens.

4. The method of claim 1, further comprising a step of covering a portion of a surface of the substrate, including the at least one capacitor and the at least one processor, after said step of populating.

5. The method of claim 4, wherein said step of covering is defined as dispensing a masking material onto the portion of the surface of the substrate including the at least one capacitor and the at least one processor to cover and protect the portion.

6. A method for manufacturing water resistant substrate, the method comprising the steps of:

providing a substrate;

populating at least one capacitor and at least one processor onto the substrate to form a circuit card assembly;

covering a portion of a surface of the substrate including the at least one capacitor and the at least one processor;

cleaning the covered portion of the substrate and the at least one capacitor and the at least one processor to form a cleaned substrate, wherein the step of cleaning comprises plasma treating the substrate including the at least one capacitor and the at least one processor using a plasma treating system, wherein the plasma treating system operates at zero volts such that surface energy of the substrate including the at least one capacitor and the at least one processor is greater than or equal to 72 dynes or a wetting angle measure with a Goniometer is less than or equal to 20°; and depositing a multi-layered water resistant coating onto the cleaned substrate, the multi-layered water resistant consisting of three layers, each of the three layers comprising silicone, wherein the step of depositing comprises dipping the cleaned substrate in a solution containing silicone to form each layer on the cleaned substrate.

* * * * *